April 17, 1962 H. P. BICKING 3,030,583

VOLTAGE CONTROLLED GATE GENERATOR

Filed Aug. 31, 1959

United States Patent Office 3,030,583

Patented Apr. 17, 1962

3,030,583

VOLTAGE CONTROLLED GATE GENERATOR

Howard P. Bicking, Warminster, Pa., assignor to the United States of America as represented by the Secretary of the Navy Filed Aug. 31, 1959, Ser. No. 837,301

6 Claims. (Cl. 328—150)

(Granted under Title 35, U.S. Code (1952), sec. 266)

The invention described herein may be manufactured and used by or for the Government of the United States of America for governmental purposes without the payment of any royalties thereon or therefor.

The present invention relates to a voltage controlled gate generator and more particularly to an amplitude sensitive voltage controlled gate generator for producing a discrete voltage level in response to a selected range of input signal potentials.

Electronic circuits exist in the prior art which generate an output signal in response to input signals which either exceed or fall below a predetermined value. In special circuit applications, the need sometimes arises for an amplitude sensitive device which is capable of producing an output indication in response to input signal potentials falling within a prescribed range.

Accordingly, the voltage controlled gate generator of the instant invention is for this general purpose, and comprises structure embracing a pair of resistance coupled amplifier stages, including unilateral current conducting devices arranged to provide biasing of the stages so that a transition in states occurs only over a prescribed range of input signal potentials.

An object of the present invention is the provision of a novel voltage controlled gate generator of the character indicated.

Another object is to provide a voltage controlled gate generator which develops a discrete voltage level in response to input signal potentials falling within predetermined limits.

A further object of the invention is the provision of an amplitude sensitive voltage controlled gate generator for developing a discrete voltage level in response to input signal potentials falling within predetermined levels, which limits may be selectively translated over a potential range of interest and the end points of which may be varied within the potential range for controlling the response characteristics of the gate generator.

An additional object of the invention is the provision of an amplitude sensitive voltage controlled gate generator for developing a discrete voltage having a first stable level for input signal potentials of amplitude below a predetermined intermediate range, a second stable level for input signal potentials of amplitude occurring within the predetermined intermediate range, and a third stable level identical with the first stable level for input signal potentials of amplitude exceeding the predetermined intermediate range.

Figure 1:
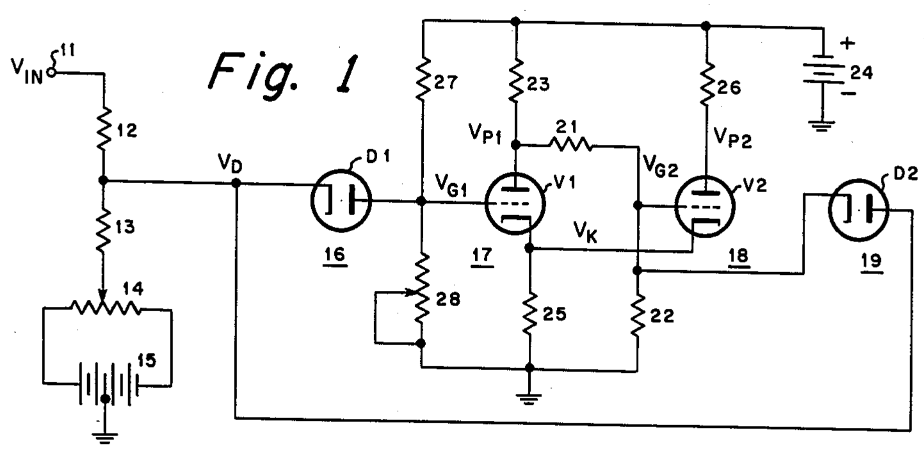
Figure 2:
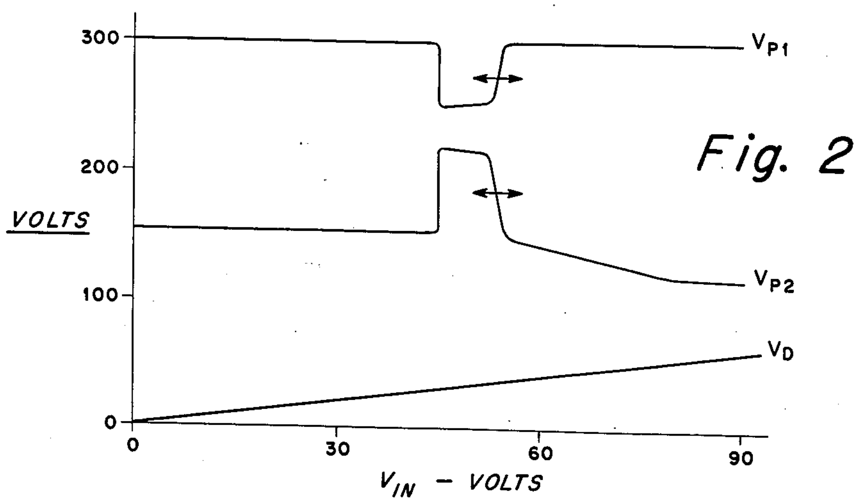
Figure 3:
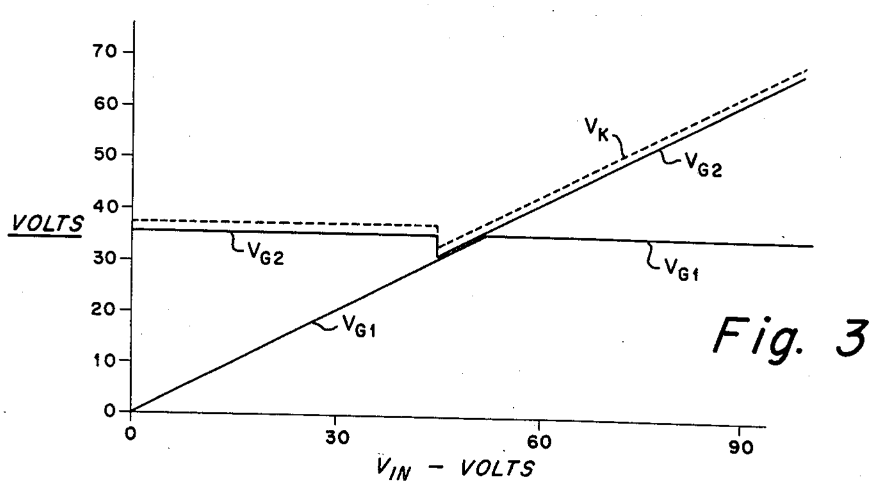

The exact nature of this invention, as well as other objects and advantages thereof, will be readily apparent from consideration of the following specification relating to the annexed drawings in which:

FIG. 1 shows an electrical schematic circuit diagram of a preferred embodiment of the invention, FIG. 2 shows a graph of representative output voltage levels including a diode input signal of exemplary character appearing in the circuit of FIG. 1 and plotted as a function of input signal potential, and FIG. 3 shows a graph of representative grid and cathode voltage levels appearing in the circuit of FIG. 1, as a function of input signal potential.

Referring now to the drawings, wherein like reference characters designate like or corresponding parts throughout the several views, there is shown in FIG. 1 an input terminal 11 connected to a pair of summing resistors 12 and 13. The lower end of resistor 13 is connected to the wiper of potentiometer 14, the latter being series connected with a constant potential source, which may be a battery 15, as shown, having a center-tap or midpotential point connected to reference ground. The cathode element of diode $D_1$ of stage 16 and the anode element of diode $D_2$ of stage 19 are connected to the junction of resistors 12 and 13.

Stages 16 and 19 use conventional diode elements, which may be a type 6AL5 electronic tube used in the instant invention.

Amplifier stages 17 and 18 embracing triode type envelopes $V_1$ and $V_2$, respectively, which may be a 12AX7, are operably coupled together through resistor 21. This resistance is part of a biasing network in series with grid load resistor 22 and anode load resistor 23. The network including these resistances is connected directly across the constant potential source 24, which may supply 300 volts. The value of the biasing network is chosen to provide a positive voltage to ground, $V_{G2}$, at the grid $V_2$ that is approximately 35 volts, in the absence of signal at terminal 11. A common cathode resistor 25 is utilized and its value is such that the cathode potential with respect to reference ground is approximately 37 volts in the absence of signal, providing a grid to cathode biasing voltage of about two volts for tube $V_2$. Resistor 26 serves as an anode load resistor for stage 18. A second biasing network consisting of resistor 27 and potentiometer 28 is provided with connection as illustrated. Potentiometer 28 is capable of varying the grid potential $V_{G1}$, which is initially adjusted to be of the order of 25 volts with respect to reference ground when diode $D_1$ of stage 16 is out of the circuit. With diode $D_1$ in the circuit with its elements connected as shown, the grid voltage $V_{G1}$ is considerably reduced, and triode $V_1$ is normally in a cutoff condition.

The operation of the amplitude sensitive voltage controlled gate generator may be best described with respect to the curves depicted in FIGS. 2 and 3. The curve designated $V_D$ in FIG. 2 is approximately related to $V_{in}$, the input signal potential, by the expression $V_D = \frac{2}{3} V_{in}$ because of the voltage division incurred in the network embracing resistors 12 and 13, and potentiometer 14. While $V_{in}$ the input signal impressed on terminal 11 in FIG. 1 is illustrated as a linear voltage having a positive slope, it should be noted that this voltage is merely exemplary, and that the input signal voltage in practice may assume the form of a step function having discrete levels, or any random magnitude signal voltage. During quiescent conditions with no signal impressed on terminal 11 in FIG. 1, diode $D_1$ conducts by virtue of the difference of potential existing between its cathode, held at the potential assumed by the wiper of potentiometer 14, and the anode of $D_1$, which is tied to the junction of resistor 27, potentiometer 28, and the grid of $V_1$. The current flow of $D_1$ is through resistor 27, causing an additional voltage drop across this resistor such that $V_{G1}$ is maintained at some low positive potential with respect to ground. Since the cathode of $V_1$ is at a potential of about plus 37 volts, $V_1$ is normally cut off and $V_2$ is normally conducting. Hence, during quiescent conditions, $V_{P1}$ the plate voltage to reference ground of $V_1$ is the plate supply voltage of 300 volts, and $V_{P2}$, the plate voltage of $V_2$, is approximately 150 volts, as depicted in FIG. 2. The operation of the amplitude sensitive voltage controlled gate generator described so far remains the same for input diode potentials, $V_D$, below about 30 volts, or for input signal potentials, $V_{in}$, below about 45 volts.

The operation now to be discussed is for input potentials of magnitude in excess of those set forth immediately above. When $V_D$ increases in a positive direction as a direct function of $V_{in}$, the voltage drop across resistor 27 decreases, and $V_{G1}$ increases. When $V_{G1}$ becomes about 30 volts, a transition in states occurs. $V_1$ begins to conduct and the voltage drop across resistor 23 is reflected as a decrease in grid potential, $V_{G2}$. $V_2$ conducts less and the cathode potential, $V_K$, falls, increasing the plate current flow of $V_1$. Thus, the circuit is regenerative, causing the leading edges of the voltages, $V_{P1}$ and $V_{P2}$, in FIG. 2 to have substantially vertical wave fronts. With respect to FIG. 3, it will be observed that in the region of 30 to 35 volts on the vertical ordinate, $V_{G1}$ and $V_{G2}$ practically coincide and assume the same potential for values of $V_{in}$ along the abscissa. In this region, both $V_1$ and $V_2$ conduct about equally. For the five volt variation in $V_{G1}$ and $V_{G2}$ indicated above, a corresponding variation is produced in the waveforms $V_{P1}$ and $V_{P2}$, respectively, shown in FIG. 2. More specifically, the lower and upper portions of the voltage waveforms $V_{P1}$ and $V_{P2}$ corresponding to the five volt variation in $V_{G1}$ and $V_{G2}$ may be considered for all practical purposes to be substantially flat, the slopes representing no more than a ten volt variation due to the heavy cathode degeneration provided by the unbypassed cathode resistor 25.

For input signals $V_D$ in excess of 35 volts, diode $D_1$ is maintained non-conducting, while diode $D_2$ now becomes conducting. Because of the low series impedance provided by diode $D_2$ when it conducts, $V_{G2}$ is for all practical purposes the same as $V_D$. Since diode $D_1$ is now non-conducting, $V_{G1}$ is constant, as shown in FIG. 3, and $V_2$ is precipitated into substantially full conduction, effecting again a transition of states. The plate voltage $V_{P1}$ rises to the full supply for input potential of $V_D$ greater than 35 volts, while $V_{P2}$ falls in the manner indicated in FIG. 2. The cathode voltage, $V_K$, shown in dashed outline in FIG. 3 will be observed at all times to exceed $V_{G2}$ by a constant difference of potential of about two volts. Its absolute value with respect to reference ground is instrumental in rapidly cutting off and maintaining $V_1$ non-conducting for $V_D$ greater than 35 volts.

The trailing edges of waveforms $V_{P1}$ and $V_{P2}$ in FIG. 2 are depicted as variable with the aid of double-headed arrow representation with respect to the $V_{in}$ parameter plotted along the abscissa. The variable width feature is herein provided by the use of potentiometer 28, which controls the bias on triode $V_1$ of stage 17, and thus directly determines the time when the amplitude sensitive voltage controlled gate generator is precipitated into its final operable state described above. Thus, the gate voltage as exemplified by waveforms $V_{P1}$ and $V_{P2}$ in FIG. 2 may be selectively varied as a function of the input signal potential.

The potentiometer 14 in FIG. 1 is effectively a centering control, which is operable to translate the generated gate voltage over a range of input signal potentials of interest. Battery 15 will be observed to supply a potential of either polarity and of a magnitude depending upon the position of the wiper. A composite voltage appears at the junction of resistors 12 and 13, which composite voltage is the sum of approximately ⅔ of the input signal potential $V_{in}$ and that present at the wiper of potentiometer 14. Since the input signal potential $V_{in}$ is effectively augmented by the voltage at the potentiometer wiper, transition in states of the amplitude sensitive voltage controlled gate generator may be selectively effected at any desired point. Thus, the generated gate as exemplified by the waveforms $V_{P1}$ and $V_{P2}$ in FIG. 2 may be selectively translated within a range of input signal potentials of interest.

While the operation of the device of the instant invention has been described with respect to input signal potentials having magnitudes which increased in a direction from zero, it should be understood that the invention is capable of accommodating input signal potentials having magnitudes which decrease in a direction toward zero.

The tabulation below lists illustrative values or types of components used in the preferred embodiment

*Tubes*

| | |
|---|---|
| $D_1$, $D_2$ | 6AL5 |
| $V_1$, $V_2$ | ½ 12AX7 |

*Resistors*

| | |
|---|---|
| 12 | 510K |
| 13 | 880K |
| 21 | 7.5M |
| 22 | 1M |
| 23 | 82K |
| 25 | 36K |
| 26 | 110K |
| 27 | 5.6M |

*Potentiometers*

| | |
|---|---|
| 14 | 300K |
| 28 | 1M |

*Legend*

K=1000 ohms
M=megohm

It should be understood, of course, that the foregoing disclosure relates to only a preferred embodiment of the invention and that numerous modifications or alterations may be made therein without departing from the spirit and scope of the invention as set forth in the appended claims.

What is claimed is:

1. A voltage controlled gate generator comprising: a pair of amplifier stages each including an anode, a cathode, and a control element wherein the cathodes of said amplifier stages are coupled in common to a point of reference potential; circuit means coupling the anode of one of said amplifier stages to the control element of the other of said amplifier stages; and an input signal terminal; circuit means coupled to said input signal terminal and to the control elements of said amplifier stages operable to couple input signals having an amplitude below a first value to the control element of one of said amplifier stages and input signals having an amplitude above a second value to the control element of the other of said amplifier stages and input signals between said first and said second values to each of the control elements of said amplifier stages.

2. The combination of claim 1 including means to apply a selectable bias potential to the control element of one of said amplifier stages.

3. The combination of claim 2 including means to apply a selectable bias potential to said input terminal.

4. A voltage controlled gate generator comprising: first and second electron discharge devices each including an anode, a cathode, and a control element; first and second diodes each including an anode and a cathode; an input signal terminal; circuit means coupling the cathode of said first diode and the anode of said second diode to said input terminal; circuit means including an anode resistor respectively coupling the anodes of each of said first and second electron discharge devices to a source of positive potential; a resistor coupling the cathodes of said electron discharge devices in common to a point of reference potential; a first resistive voltage divider network connected between said source of positive potential and said point of reference potential; circuit means coupling the anode of said first diode and the control element of said first electron discharge device to an intermediate portion of said first voltage divider network; a second resistive voltage divider network connected between said source of positive potential and said point of reference potential, said second voltage divider network including the anode resistor of said first electron discharge device; and circuit means coupling the cathode of said second diode and the control element of said second electron discharge device to an intermediate portion of said second voltage divider network.

5. The combination of claim 4 wherein a portion of said first voltage divider network is variable in magnitude.

6. The combination of claim 5 including means to apply a bias potential of selectable magnitude to said input signal terminal.

References Cited in the file of this patent

UNITED STATES PATENTS

| | | |
|---|---|---|
| 2,562,660 | Chance | July 31, 1951 |
| 2,632,845 | Goldberg | Mar. 24, 1953 |
| 2,861,200 | Henle et al. | Nov. 18, 1958 |
| 2,894,128 | Wilson | July 7, 1959 |